United States Patent
Chen et al.

(10) Patent No.: US 8,948,416 B2
(45) Date of Patent: *Feb. 3, 2015

(54) WIRELESS TELEPHONE HAVING MULTIPLE MICROPHONES

(75) Inventors: Juin-Hwey Chen, Irvine, CA (US); James Bennett, Hroznetin (CZ)

(73) Assignee: Broadcom Corporation, Irvine, CA (US)

( * ) Notice: Subject to any disclaimer, the term of this patent is extended or adjusted under 35 U.S.C. 154(b) by 597 days.

This patent is subject to a terminal disclaimer.

(21) Appl. No.: 12/432,302

(22) Filed: Apr. 29, 2009

(65) Prior Publication Data

US 2009/0209290 A1 Aug. 20, 2009

Related U.S. Application Data

(63) Continuation of application No. 11/018,921, filed on Dec. 22, 2004, now abandoned.

(51) Int. Cl.
*H04B 15/00* (2006.01)
*H04M 1/60* (2006.01)
*G10L 21/0208* (2013.01)
(Continued)

(52) U.S. Cl.
CPC ......... *H04M 1/6008* (2013.01); *G10L 21/0208* (2013.01); *H03G 3/32* (2013.01); *G10L 2021/02165* (2013.01)
USPC ......... 381/94.3; 381/94.1; 381/122; 704/226; 704/233

(58) Field of Classification Search
CPC ....................................... H04B 15/00

USPC ......... 381/94.1–94.3, 94.7, 110, 91–92, 122; 704/233, 226

See application file for complete search history.

(56) References Cited

U.S. PATENT DOCUMENTS

| | | |
|---|---|---|
| 3,770,911 A | 11/1973 | Knowles et al. |
| 4,658,426 A | 4/1987 | Chabries et al. |
| 5,109,390 A | 4/1992 | Gilhousen et al. |

(Continued)

FOREIGN PATENT DOCUMENTS

| | | |
|---|---|---|
| EP | 0 569 216 A1 | 11/1993 |
| EP | 0 661 904 A2 | 7/1995 |

OTHER PUBLICATIONS

Ernst warsitz & Reinhold Haeb-Umbach, "speech enhancement with a new generalized eigenvector blocking matrix for application in a generalized side lobe canceller", IEEE, p. 73-75.*

(Continued)

*Primary Examiner* — Disler Paul
(74) *Attorney, Agent, or Firm* — Sterne, Kessler, Goldstein & Fox P.L.L.C.

(57) ABSTRACT

The present invention is directed to a wireless telephone having a first microphone and a second microphone and a method for processing audio signal in a wireless telephone having a first microphone and a second microphone. The wireless telephone includes a first microphone, a second microphone, and a signal processor. The first microphone outputs a first audio signal, the first audio signal comprising a voice component and a background noise component. The second microphone outputs a second audio signal. The signal processor increases a ratio of the voice component to the noise component of the first audio signal based on the content of at least one of the first audio signal and the second audio signal to produce a third audio signal.

20 Claims, 17 Drawing Sheets

(51) Int. Cl.
  *H03G 3/32* (2006.01)
  *G10L 21/0216* (2013.01)

(56) References Cited

U.S. PATENT DOCUMENTS

| | | | |
|---|---|---|---|
| 5,125,032 A | 6/1992 | Meister et al. |
| 5,233,349 A | 8/1993 | Moulsley |
| 5,353,376 A | 10/1994 | Oh et al. |
| 5,426,703 A | 6/1995 | Hamabe et al. |
| 5,546,458 A | 8/1996 | Iwami |
| 5,581,620 A | 12/1996 | Brandstein et al. |
| 5,602,962 A | 2/1997 | Kellermann |
| 5,610,991 A | 3/1997 | Janse |
| 5,706,282 A | 1/1998 | Chung |
| 5,740,256 A | 4/1998 | Castello Da Costa et al. |
| 5,752,226 A | 5/1998 | Chan et al. |
| 5,754,665 A | 5/1998 | Hosoi |
| 5,761,318 A | 6/1998 | Shimauchi et al. |
| 5,796,819 A | 8/1998 | Romesburg |
| 5,835,851 A | 11/1998 | Rasmusson et al. |
| 5,870,681 A | 2/1999 | Myer |
| 5,917,919 A | 6/1999 | Rosenthal |
| 6,011,843 A | 1/2000 | Hochman et al. |
| 6,122,610 A | 9/2000 | Isabelle |
| 6,154,499 A | 11/2000 | Bhaskar et al. |
| 6,163,608 A | 12/2000 | Romesburg et al. |
| 6,219,645 B1 | 4/2001 | Byers |
| 6,236,862 B1 | 5/2001 | Erten et al. |
| 6,269,161 B1 | 7/2001 | McLaughlin et al. |
| 6,339,758 B1 | 1/2002 | Kanazawa et al. |
| 6,507,653 B1 | 1/2003 | Romesburg |
| 6,510,224 B1 | 1/2003 | Christensson et al. |
| 6,594,367 B1 | 7/2003 | Marash et al. |
| 6,647,367 B2 | 11/2003 | McArthur et al. |
| 6,668,062 B1 * | 12/2003 | Luo et al. ............... 381/122 |
| 6,694,028 B1 | 2/2004 | Matsuo |
| 6,707,910 B1 | 3/2004 | Valve et al. |
| 6,717,991 B1 | 4/2004 | Gustafsson et al. |
| 6,760,882 B1 | 7/2004 | Gesbert et al. |
| 6,768,979 B1 | 7/2004 | Menendez-Pidal et al. |
| 6,810,273 B1 | 10/2004 | Mattila et al. |
| 6,889,187 B2 | 5/2005 | Zhang |
| 6,937,980 B2 | 8/2005 | Krasny et al. |
| 6,952,482 B2 | 10/2005 | Balan et al. |
| 6,963,649 B2 | 11/2005 | Vaudrey et al. |
| 6,985,856 B2 | 1/2006 | Wang et al. |
| 6,990,194 B2 | 1/2006 | Mikesell et al. |
| 7,003,099 B1 * | 2/2006 | Zhang et al. ............ 379/406.03 |
| 7,010,134 B2 | 3/2006 | Jensen |
| 7,058,185 B1 | 6/2006 | Egelmeers et al. |
| 7,062,049 B1 | 6/2006 | Inoue et al. |
| 7,099,821 B2 | 8/2006 | Visser et al. |
| 7,116,791 B2 | 10/2006 | Matsuo |
| 7,127,218 B2 | 10/2006 | Lindenmeier |
| 7,146,013 B1 | 12/2006 | Saito et al. |
| 7,158,764 B2 | 1/2007 | Thayer et al. |
| 7,164,710 B2 | 1/2007 | Komaili et al. |
| 7,171,246 B2 | 1/2007 | Mattila et al. |
| 7,174,002 B1 | 2/2007 | Burns |
| 7,174,022 B1 * | 2/2007 | Zhang et al. ............ 381/92 |
| 7,181,232 B2 | 2/2007 | Lin et al. |
| 7,206,418 B2 * | 4/2007 | Yang et al. ............ 381/92 |
| 7,286,946 B2 | 10/2007 | Yoneda |
| 7,346,175 B2 | 3/2008 | Hui et al. |
| 7,499,686 B2 | 3/2009 | Sinclair et al. |
| 7,602,926 B2 * | 10/2009 | Roovers ............ 381/94.2 |
| 7,983,720 B2 | 7/2011 | Chen |
| 2001/0034601 A1 * | 10/2001 | Chujo et al. ............ 704/233 |
| 2002/0009203 A1 | 1/2002 | Erten |
| 2002/0048376 A1 | 4/2002 | Ukita |
| 2002/0141601 A1 | 10/2002 | Finn et al. |
| 2002/0172350 A1 | 11/2002 | Edwards et al. |
| 2002/0172374 A1 | 11/2002 | Bizjak |
| 2002/0193130 A1 | 12/2002 | Yang et al. |
| 2003/0021389 A1 | 1/2003 | Hirai et al. |
| 2003/0022648 A1 | 1/2003 | Wight |
| 2003/0027600 A1 | 2/2003 | Krasny et al. |
| 2003/0040908 A1 | 2/2003 | Yang et al. |
| 2003/0044025 A1 | 3/2003 | Ouyang et al. |
| 2003/0053639 A1 | 3/2003 | Beaucoup et al. |
| 2003/0060219 A1 | 3/2003 | Parsiokas |
| 2003/0086575 A1 * | 5/2003 | Balan et al. ............ 381/94.2 |
| 2003/0091182 A1 | 5/2003 | Marchok et al. |
| 2003/0156722 A1 | 8/2003 | Taenzer |
| 2003/0179888 A1 | 9/2003 | Burnett et al. |
| 2003/0200092 A1 | 10/2003 | Gao et al. |
| 2003/0228023 A1 | 12/2003 | Burnett et al. |
| 2003/0233213 A1 | 12/2003 | Balan et al. |
| 2004/0001599 A1 | 1/2004 | Etter et al. |
| 2004/0057586 A1 | 3/2004 | Licht |
| 2004/0086109 A1 | 5/2004 | Takada |
| 2004/0092297 A1 | 5/2004 | Huang |
| 2004/0152418 A1 | 8/2004 | Sinha et al. |
| 2004/0193411 A1 | 9/2004 | Hui et al. |
| 2006/0007994 A1 | 1/2006 | Lai et al. |
| 2006/0013412 A1 | 1/2006 | Goldin |
| 2006/0133621 A1 | 6/2006 | Chen |
| 2006/0133622 A1 | 6/2006 | Chen |
| 2006/0135085 A1 | 6/2006 | Chen |
| 2006/0147063 A1 | 7/2006 | Chen |
| 2006/0154623 A1 | 7/2006 | Chen et al. |
| 2007/0116300 A1 | 5/2007 | Chen |
| 2009/0111507 A1 | 4/2009 | Chen |

OTHER PUBLICATIONS

Audio.technica. A Brief Guide to Microphones, copyright 2001 Audio-Technica U.S. Inc., 6 pages, printed on Feb. 17, 2005, printed from http://www.audio-technica.com/using/mphones/guide/pattern.html.

Chen, J.H., U.S. Appl. No. 11/979,995, filed Oct. 30, 2007, entitled "Speech Intelligibility in Telephones with Multiple Microphones."

Final Office Action and Notice of References Cited for U.S. Appl. No. 11/018,921, dated Mar. 18, 2009, 22 pages.

International Search Report for EP Appl. No. 05022377.5, dated May 10, 2006, 3 pages.

Non-Final Office Action and Notice of References Cited for U.S. Appl. No. 11/018,921, dated Oct. 29, 2008, 19 pages.

Non-Final Office Action and Notice of References Cited for U.S. Appl. No. 11/065,131, dated Dec. 24, 2008, 18 pages.

Non-Final Office Action and Notice of References Cited for U.S. Appl. No. 11/065,131, dated Jun. 18, 2008, 18 pages.

Non-Final Office Action and Notice of References Cited for U.S. Appl. No. 11/065,131, dated May 18, 2007, 13 pages.

Non-Final Office Action and Notice of References Cited for U.S. Appl. No. 11/065,131, dated Nov. 2, 2007, 12 pages.

Non-Final Office Action and Notice of References Cited for U.S. Appl. No. 11/135,491, dated Dec. 8, 2008, 11 pages.

Non-Final Office Action and Notice of References Cited for U.S. Appl. No. 11/135,491, dated Jun. 9, 2008, 9 pages.

Non-Final Office Action and Notice of References Cited for U.S. Appl. No. 11/135,491, dated Nov. 2, 2007, 11 pages.

Non-Final Office Action and Notice of References Cited for U.S. Appl. No. 11/215,304, dated Dec. 14, 2007, 18 pages.

Non-Final Office Action and Notice of References Cited for U.S. Appl. No. 11/215,304, dated Dec. 30, 2008, 19 pages.

Non-Final Office Action and Notice of References Cited for U.S. Appl. No. 11/215,304, dated Jul. 9, 2008, 24 pages.

Amendment and Reply Under 37 C.F.R. § 1.111 as filed in U.S. Appl. No. 11/065,131 on Aug. 20, 2007 (18 pages).

Crown, copyright 1999 Crown International Inc., 3 pages, printed on Dec. 30, 2004, printed from http://www.crownaudio.com/mic_htm/tips/mictip2.htm.

D.L. Freeman et al., "The Voice Activity Detector for the Pan-European Digital Cellular Mobile Telephone Service", 1989, IEEE. CH2676-2/89/0000-0369. p. 369-373.

Examination Report, dated Oct. 11, 2007, from EP Appl. No. 05022377.5, 4 pages.

International Search Report for EP Appl. No. 05026022.3, dated May 10, 2006, 4 pages.

(56) References Cited

OTHER PUBLICATIONS

Kerem, S., "Dual Microphones Separate Voice From Noise," EDN Electrical Design News, Reed Business Information, Highlands Ranch, CO, us, vol. 39, No. 13, Jun. 23, 1994, p. 82.

McCowan, I.A., "Robust Speech Recognition using Microphone Arrays", PhD Thesis, Queensland University of Technology, pp. 1-38, Australia, 2001.

Official Office Action for CN Application No. 2006100841214, dated Aug. 29, 2008, 7 pages.

Ramamoorthy, V., "Speech Coding Using Modulo-PCM with Side Information", IEEE International Conference on Acoustics, Speech, and Signal Processing, 1981; pp. 832-835.

Non-Final Rejection mailed Jul. 23, 2009 for U.S. Appl. No. 11/018,921, filed Dec. 22, 2004; 21 pages.

Final Rejection mailed Nov. 24, 2009, for U.S. Appl. No. 11/018,921, filed Dec. 22, 2004; 22 pages.

Final Rejection mailed Aug. 6, 2009, for U.S. Appl. No. 11/065,131, filed Feb. 24, 2005; 16 pages.

Non-Final Rejection mailed Dec. 10, 2009, for U.S. Appl. No. 11/065,131, filed Feb. 24, 2005; 16 pages.

Final Rejection mailed May 18, 2009 for U.S. Appl. No. 11/135,491, filed May 24, 2005; 12 pages.

Non-Final Rejection mailed Oct. 28, 2009 for U.S. Appl. No. 11/135,491, filed May 24, 2005; 11 pages.

Notice of Allowance mailed May 11, 2010 for U.S. Appl. No. 11/135,491, filed May 24, 2005; 9 pages.

Notice of Allowance mailed Aug. 26, 2010 for U.S. Appl. No. 11/135,491, filed May 24, 2005; 10 pages.

Notice of Allowance mailed Mar. 11, 2011 for U.S. Appl. No. 11/135,491, filed May 24, 2005; 9 pages.

Final Rejection mailed Jun. 24, 2009 for U.S. Appl. No. 11/215,304, filed Aug. 31, 2005; 20 pages.

Non-Final Rejection mailed Apr. 15, 2010 for U.S. Appl. No. 11/215,304, filed Aug. 31, 2005; 24 pages.

Non-Final Rejection mailed Nov. 23, 2010 for U.S. Appl. No. 11/215,304, filed Aug. 31, 2005; 23 pages.

Non-Final Rejection mailed May 26, 2011 for U.S. Appl. No. 11/215,304, filed Aug. 31, 2005; 28 pages.

Final Rejection mailed Nov. 2, 2011 for U.S. Appl. No. 11/215,304, filed Aug. 31, 2005; 31 pages.

Non-Final Rejection mailed Aug. 3, 2010 for U.S. Appl. No. 11/239,351, filed Sep. 30, 2005; 16 pages.

Final Rejection mailed Mar. 4, 2011 for U.S. Appl. No. 11/239,351, filed Sep. 30, 2005; 16 pages.

Non-Final Rejection mailed Mar. 22, 2010 for U.S. Appl. No. 11/653,858, filed Jan. 17, 2007; 15 pages.

Final Rejection mailed Oct. 28, 2010 for U.S. Appl. No. 11/653,858, filed Jan. 17, 2007; 18 pages.

Non-Final Rejection mailed Nov. 9, 2011 for U.S. Appl. No. 11/653,858, filed Jan. 17, 2007; 17 pages.

Non-Final Rejection mailed Sep. 9, 2010, for U.S. Appl. No. 11/976,995, filed Oct. 30, 2007, 12 pages.

Non-Final Rejection mailed Mar. 18, 2011 for U.S. Appl. No. 11/976,995, filed Oct. 30, 2007; 9 pages.

Final Rejection mailed Aug. 17, 2011 for U.S. Appl. No. 11/976,995, filed Oct. 30, 2007; 6 pages.

Notice of Allowance mailed Oct. 12, 2011 for U.S. Appl. No. 11/976,995, filed Oct. 30, 2007; 5 pages.

Office Action directed to related to Taiwanese Patent Application No. 095118220, mailed Dec. 20, 2011; 7 pages.

Notice of Allowance mailed Aug. 2, 2012 for U.S. Appl. No. 11/215,304, filed Aug. 31, 2005; 8 pages.

Non-Final Rejection mailed Feb. 28, 2012 for U.S. Appl. No. 11/239,351, filed Sep. 30, 2005; 11 pages.

Final Rejection mailed Apr. 3, 2012 for U.S. Appl. No. 11/653,858, filed Jan. 17, 2007; 22 pages.

Non-Final Office Action mailed Nov. 21, 2012 for U.S. Appl. No. 11/239,351; 12 pages.

USPTO Communication faxed Mar. 2, 2012 for U.S. Appl. No. 11/653,858, filed Jan. 17, 2007; 4 pages.

Notice of Allowance mailed Dec. 21, 2012 for U.S. Appl. No. 11/976,995, filed Oct. 30, 2007; 5 pages.

Notice of Allowance mailed Mar. 28, 2013 for U.S. Appl. No. 11/215,304, filed Aug. 31, 2005; 9 pages.

Examiner's Answer mailed Jun. 3, 2013 for U.S. Appl. No. 11/239,351, filed Sep. 30, 2005; 7 pages.

\* cited by examiner

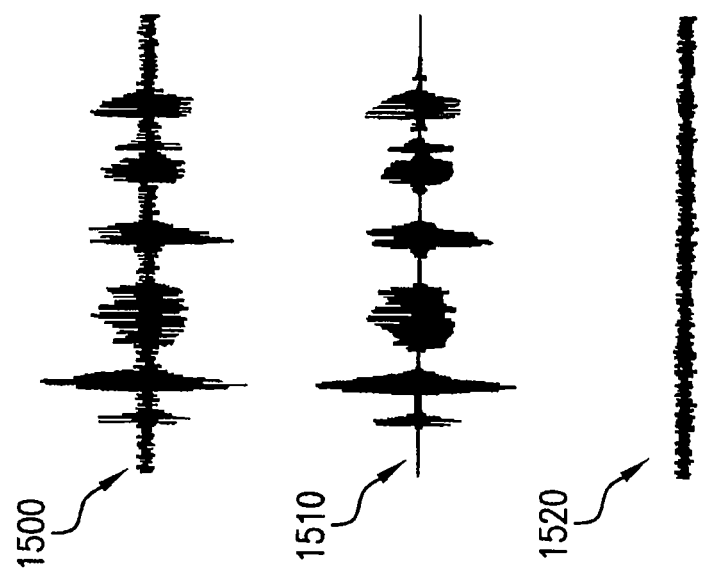
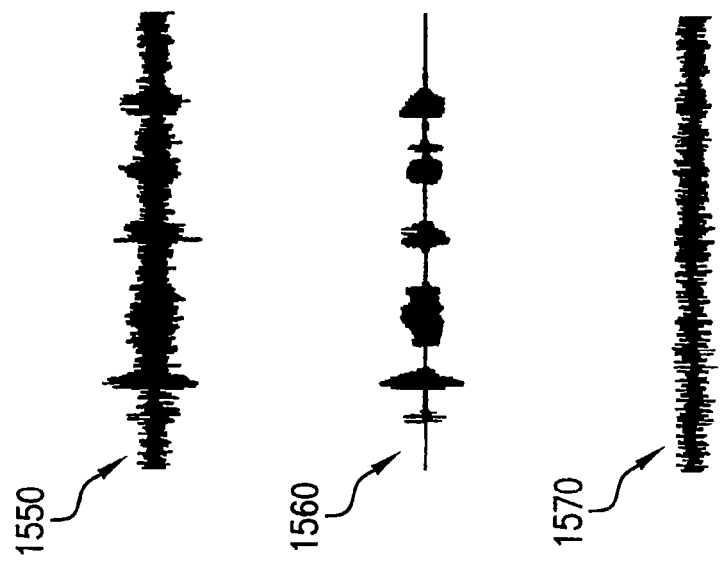
FIG. 15

WIRELESS TELEPHONE HAVING MULTIPLE MICROPHONES

CROSS REFERENCE TO RELATED APPLICATIONS

This application is a continuation of U.S. patent application Ser. No. 11/018,921 to Chen et al. ("the '921 application"), entitled "Wireless Telephone Having Multiple Microphones" and filed Dec. 22, 2004, now pending and published as U.S. Publication No. 2006/0133621, the entirety of which is incorporated by reference as if fully set forth herein.

This application is related to each of the following applications which are continuations-in-part of the '921 application: U.S. patent application Ser. No. 11/976,995 to Chen, entitled "Speech Intelligibility in Telephones with Multiple Microphones" and filed Oct. 30, 2007, now pending; which application is a continuation-in-part of U.S. patent application Ser. No. 11/653,858 to Chen, entitled "Channel Decoding for Wireless Telephones with Multiple Microphones and Multiple Description Transmission" and filed Jan. 17, 2007, now pending and published as U.S. Publication No. 2007/0116300; which is a continuation-in-part of U.S. patent application Ser. No. 11/239,351 to Chen, entitled "Echo Cancellation in Telephones with Multiple Microphones" and filed Sep. 30, 2005, now pending and published as U.S. Publication No. 2006/0147063; which application is a continuation-in-part of U.S. patent application Ser. No. 11/215,304 to Chen et al., entitled "Wireless Telephone with Multiple Microphones and Multiple Description Transmission" and filed Aug. 31, 2005, now pending and published as U.S. Publication No. 2006/0154623; which application is a continuation-in-part of U.S. patent application Ser. No. 11/135,491 to Chen, entitled "Wireless Telephone with Adaptive Microphone Array" and filed May 24, 2005, now pending and published as U.S. Publication No. 2006/0133622; which application is a continuation-in-part of U.S. patent application Ser. No. 11/065,131 to Chen, entitled "Wireless Telephone with Uni-Directional and Omni-Directional Microphones" and filed Feb. 24, 2005, now pending and published as U.S. Publication No. 2006/0135085; which application is a continuation-in-part of the '921 application. The entirety of each of the foregoing applications is incorporated by reference herein.

BACKGROUND OF THE INVENTION

1. Field of the Invention

The present invention relates generally to mobile telecommunication devices, and in particular to wireless telephones.

2. Background Art

Background noise is an inherent problem in wireless telephone communication. Conventional wireless telephones include a single microphone that receives a near-end user's voice and outputs a corresponding audio signal for subsequent encoding and transmission to the telephone of a far-end user. However, the audio signal output by this microphone typically includes both a voice component and a background noise component. As a result, the far-end user often has difficulty deciphering the desired voice component against the din of the embedded background noise component.

Conventional wireless telephones often include a noise suppressor to reduce the detrimental effects of background noise. A noise suppressor attempts to reduce the level of the background noise by processing the audio signal output by the microphone through various algorithms. These algorithms attempt to differentiate between a voice component of the audio signal and a background noise component of the audio signal, and then attenuate the level of the background noise component.

Conventional wireless telephones often also include a voice activity detector (VAD) that attempts to identify and transmit only those portions of the audio signal that include a voice component. One benefit of VAD is that bandwidth is conserved on the telecommunication network because only selected portions of the audio signal are transmitted.

In order to operate effectively, both the noise suppressor and the VAD must be able to differentiate between the voice component and the background noise component of the input audio signal. However, in practice, differentiating the voice component from the background noise component is difficult.

What is needed then, is a wireless telephone that better mitigates the effect of background noise present in an input audio signal as compared to conventional wireless telephones, thereby resulting in the transmission of a cleaner voice signal during telephone communication. In particular, the desired wireless telephone should better differentiate between a voice component and a background noise component of an input audio signal as compared to conventional wireless telephones. Based on this differentiation, the improved wireless telephone should operate to cancel the background noise component of the audio signal. Additionally or alternatively, based on this differentiation, the improved wireless telephone should provide improved noise suppression and/or VAD functionality.

BRIEF SUMMARY OF THE INVENTION

The present invention is directed to a wireless telephone having a first microphone and a second microphone, wherein an audio signal output from the second microphone is used to differentiate between a voice component and a background noise component of an audio signal output from the first microphone. Based on this differentiation, a wireless telephone in accordance with an embodiment of the present invention operates to cancel the background noise component of the audio signal output from the first microphone. Additionally or alternatively, based on this differentiation, a wireless telephone in accordance with an embodiment of the present invention provides better noise suppression and/or VAD functionality.

In particular, a wireless telephone in accordance with an embodiment of the present invention includes a first microphone, a second microphone, and a signal processor. The first microphone outputs a first audio signal that includes a voice component and a background noise component. The second microphone outputs a second audio signal. The signal processor increases a ratio of the voice component to the noise component of the first audio signal based on the content of at least one of the first audio signal and the second audio signal to produce a third audio signal.

In one embodiment of the present invention the signal processor includes a background noise cancellation module. The background noise cancellation module receives the first and second audio signals and cancels at least a portion of the background noise component of the first audio signal based on the content of the second audio signal to produce the third audio signal.

In an alternative embodiment of the present invention the signal processor includes a noise suppressor. The noise suppressor receives the first and second audio signals and suppresses at least a portion of the background noise component of the first audio signal based on the content of the first audio signal and the second audio signal to produce the third audio signal.

A wireless telephone in accordance with another embodiment of the present invention includes a first microphone, a second microphone, and a voice activity detector (VAD). The first microphone outputs a first audio signal that includes a voice component and a background noise component. The second microphone outputs a second audio signal. The VAD receives the first and second audio signals and detects time intervals in which the voice component is present in the first audio signal based on the content of the first audio signal and the second audio signal. In an example embodiment, the VAD provides input to a transmitter relating to the time intervals in which a voice component is present in the first audio signal. The transmitter selectively transmits the first audio signal to another telephone responsive to the input.

The present invention also provides a method for processing audio signals in a wireless telephone having a first microphone and a second microphone. In an embodiment, the method includes outputting a first audio signal from the first microphone, wherein the first audio signal includes a voice component and a background noise component. A second audio signal is output from the second microphone. A ratio of the voice component to the noise component of the first audio signal is increased based on the content of at least one of the first audio signal and the second audio signal to produce a third audio signal.

Increasing the ratio of the voice component to background noise component may include canceling at least a portion of the background noise component of the first audio signal based on the content of the second audio signal to produce the third audio signal. Alternatively, increasing the ratio of the voice component to background noise component may include suppressing at least a portion of the background noise component of the first audio signal based on the content of the first audio signal and the second audio signal to produce the third audio signal.

A further method for processing audio signals in a wireless telephone having a first microphone and a second microphone in accordance with an embodiment of the present invention includes outputting a first audio signal from the first microphone, wherein the first audio signal comprises a voice component and a background noise component. A second audio signal is output from the second microphone. Time intervals in which the voice component is present in the first audio signal are detected based on the content of the first audio signal and the second audio signal.

Further embodiments and features of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 15 shows exemplary plots depicting a voice component and a background noise component output by first and second microphones of a wireless telephone, in accordance with an embodiment of the present invention.

Figure 1A:
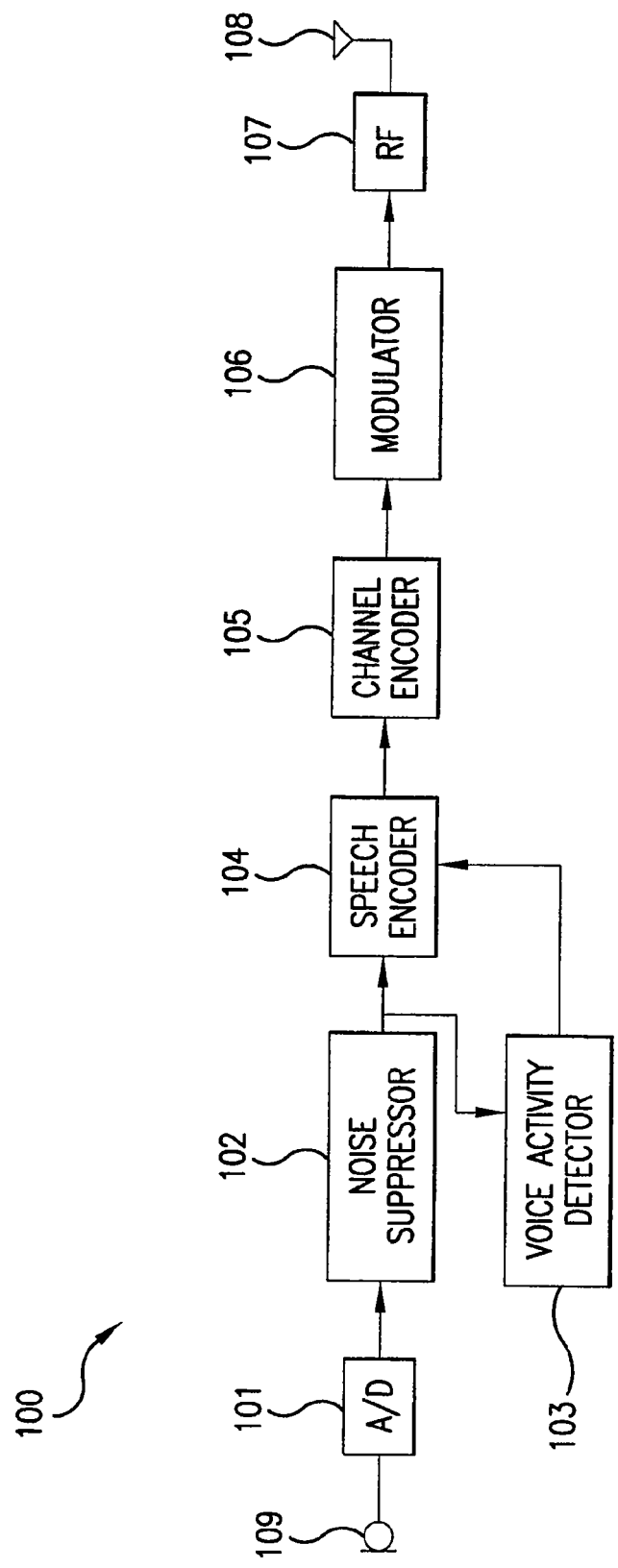
FIG. 1A is a functional block diagram of the transmit path of a conventional wireless telephone.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

The present invention provides a wireless telephone implemented with a first microphone and a second microphone. As will be described in more detail herein, an audio signal output by the second microphone is used to improve the quality of an audio signal output by the first microphone and/or to improve noise suppression and/or VAD technology incorporated within the wireless telephone.

The detailed description of the invention is divided into six subsections. In the first subsection, an overview of the workings of a conventional wireless telephone are discussed. This discussion facilitates the description of the present invention. In the second subsection, an overview of a wireless telephone implemented with a first microphone and second microphone is presented. In the third subsection, a first embodiment of the present invention is described in which the output of the second microphone is used to cancel a background noise component output by the first microphone. In the fourth subsection, a second embodiment of the present invention is described in which the output of the second microphone is used to suppress a background noise component output by the first microphone. In the fifth subsection, a third embodiment of the present invention is discussed in which the output of the second microphone is used to improve VAD technology incorporated in the wireless telephone. In the sixth subsection, alternative arrangements of the present invention are discussed.

I. Overview of Signal Processing within Conventional Wireless Telephones

Conventional wireless telephones use what is commonly referred to as encoder/decoder technology. The transmit path of a wireless telephone encodes an audio signal picked up by a microphone onboard the wireless telephone. The encoded audio signal is then transmitted to another telephone. The receive path of a wireless telephone receives signals transmitted from other wireless telephones. The received signals are then decoded into a format that an end user can understand.

FIG. 1A is a functional block diagram of a typical transmit path 100 of a conventional digital wireless telephone. Transmit path 100 includes a microphone 109, an analog-to-digital (A/D) converter 101, a noise suppressor 102, a voice activity detector (VAD) 103, a speech encoder 104, a channel encoder 105, a modulator 106, a radio frequency (RF) module 107, and an antenna 108.

Microphone 109 receives a near-end user's voice and outputs a corresponding audio signal, which typically includes both a voice component and a background noise component. The A/D converter 101 converts the audio signal from an analog to a digital form. The audio signal is next processed through noise suppressor 102. Noise suppressor 102 uses various algorithms, known to persons skilled in the pertinent art, to suppress the level of embedded background noise that is present in the audio signal.

Speech encoder 104 converts the output of noise suppressor 102 into a channel index. The particular format that speech encoder 104 uses to encode the signal is dependent upon the type of technology being used. For example, the signal may be encoded in formats that comply with GSM (Global Standard for Mobile Communication), CDMA (Code Division Multiple Access), or other technologies commonly used for telecommunication. These different encoding formats are known to persons skilled in the relevant art and for the sake of brevity are not discussed in further detail.

As shown in FIG. 1A, VAD 103 also receives the output of noise suppressor 102. VAD 103 uses algorithms known to persons skilled in the pertinent art to analyze the audio signal output by noise suppressor 102 and determine when the user is speaking. VAD 103 typically operates on a frame-by-frame basis to generate a signal that indicates whether or not a frame includes voice content. This signal is provided to speech encoder 104, which uses the signal to determine how best to process the frame. For example, if VAD 103 indicates that a frame does not include voice content, speech encoder 103 may skip the encoding of the frame entirely.

Channel encoder 105 is employed to reduce bit errors that can occur after the signal is processed through the speech encoder 104. That is, channel encoder 105 makes the signal more robust by adding redundant bits to the signal. For example, in a wireless phone implementing the original GSM technology, a typical bit rate at the output of the speech encoder might be about 13 kilobits (kb) per second, whereas, a typical bit rate at the output of the channel encoder might be about 22 kb/sec. The extra bits that are present in the signal after channel encoding do not carry information about the speech; they just make the signal more robust, which helps reduce the bit errors.

The modulator 106 combines the digital signals from the channel encoder into symbols, which become an analog wave form. Finally, RF module 107 translates the analog wave forms into radio frequencies, and then transmits the RF signal via antenna 108 to another telephone.

Figure 1B:
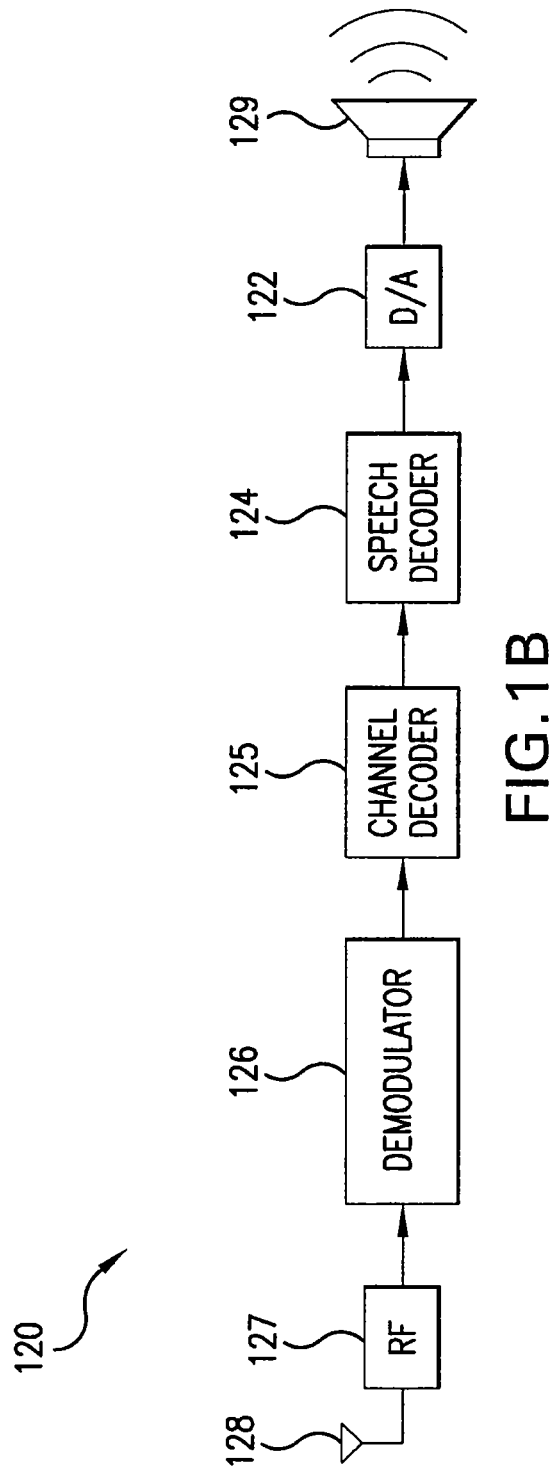
FIG. 1B is a functional block diagram of the receive path of a conventional wireless telephone.

FIG. 1B is a functional block diagram of a typical receive path 120 of a conventional wireless telephone. Receive path 120 processes an incoming signal in almost exactly the reverse fashion as compared to transmit path 100. As shown in FIG. 1B, receive path 120 includes an antenna 128, an RF module 127, a channel decoder 125, a speech decoder 124, a digital to analog (D/A) converter 122, and a speaker 129.

During operation, an analog input signal is received by antenna 128 and RF module 127 translates the radio frequencies into baseband frequencies. Demodulator 126 converts the analog waveforms back into a digital signal. Channel decoder 125 decodes the digital signal back into the channel index, which speech decoder 124 converts back into digitized speech. D/A converter 122 converts the digitized speech into analog speech. Lastly, speaker 129 converts the analog speech signal into a sound pressure wave so that it can be heard by an end user.

II. Overview of a Wireless Telephone Having Two Microphones in Accordance with The Present Invention A wireless telephone in accordance with an embodiment of the present invention includes a first microphone and a second microphone. As mentioned above and as will be described in more detail herein, an audio signal output by the second microphone is used to improve the quality of an audio signal output by the first microphone or to support improved VAD technology.

Figure 2:
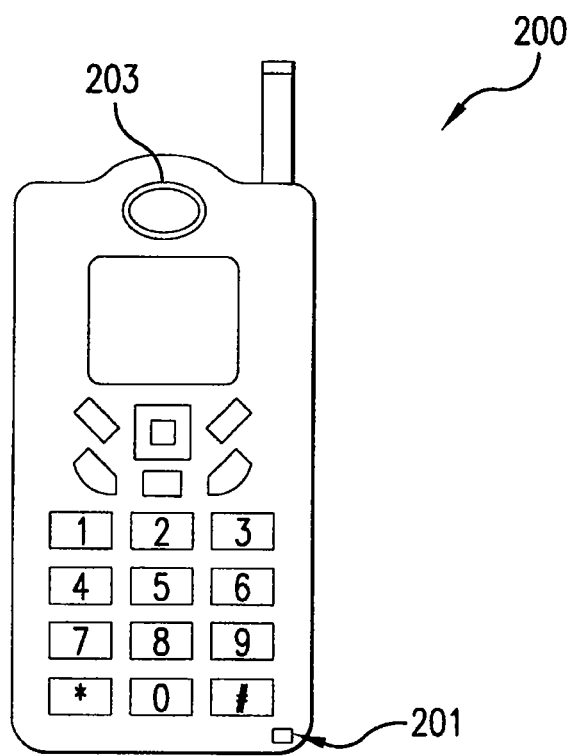
FIG. 2 is a schematic representation of the front portion of a wireless telephone in accordance with an embodiment of the present invention.
Figure 3:
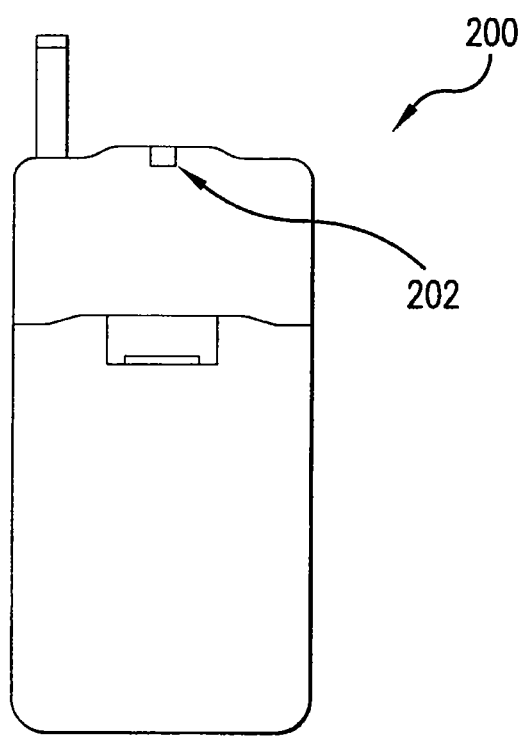
FIG. 3 is a schematic representation of the back portion of a wireless telephone in accordance with an embodiment of the present invention.

FIGS. 2 and 3 illustrate front and back portions, respectively, of a wireless telephone 200 in accordance with an embodiment of the present invention. As shown in FIG. 2, the front portion of wireless telephone 200 includes a first microphone 201 and a speaker 203 located thereon. First microphone 201 is located so as to be close to a user's mouth during regular use of wireless telephone 200. Speaker 203 is located so as to be close to a user's ear during regular use of wireless telephone 200.

As shown in FIG. 3, second microphone 202 is located on the back portion of wireless telephone 200. Second microphone 202 is located so as to be further away from a user's mouth during regular use than first microphone 201, and preferably is located to be as far away from the user's mouth during regular use as possible.

By mounting first microphone 201 so that it is closer to a user's mouth than second microphone 202 during regular use, the amplitude of the user's voice as picked up by the first microphone 201 will likely be greater than the amplitude of the user's voice as picked up by second microphone 202. Similarly, by so mounting first microphone 201 and second microphone 202, the amplitude of any background noise picked up by second microphone 202 will likely be greater than the amplitude of the background noise picked up by first microphone 201. The manner in which the signals generated by first microphone 201 and second microphone 202 are utilized by wireless telephone 200 will be described in more detail below.

FIGS. 2 and 3 show an embodiment in which first and second microphones 201 and 202 are mounted on the front and back portion of a wireless telephone, respectively. However, the invention is not limited to this embodiment and the first and second microphones may be located in other locations on a wireless telephone and still be within the scope of the present invention. For performance reasons, however, it is preferable that the first and second microphone be mounted so that the first microphone is closer to the mouth of a user than the second microphone during regular use of the wireless telephone.

Figure 4:
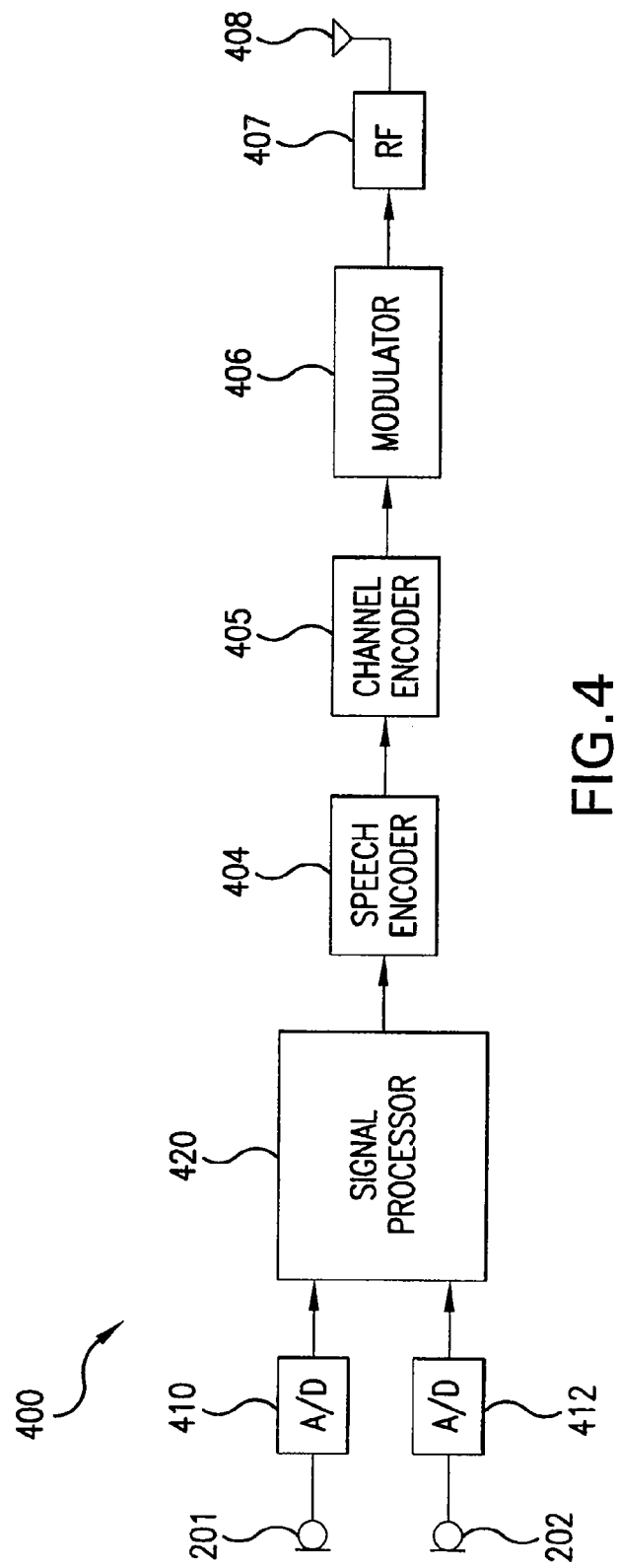
FIG. 4 is a functional block diagram of a transmit path of a wireless telephone in accordance with an embodiment of the present invention.

FIG. 4 is a functional block diagram of a transmit path 400 of a wireless telephone that is implemented with a first microphone and a second microphone in accordance with an embodiment of the present invention. Transmit path 400 includes a first microphone 201 and a second microphone 202. In addition, transmit path 400 includes an A/D converter 410, an A/D converter 412, a signal processor 420, a speech encoder 404, a channel encoder 405, a modulator 406, an RF module 407, and an antenna 408. Speech encoder 404, channel encoder 405, modulator 406, RF module 407, and antenna 408 are respectively analogous to speech encoder 104, channel encoder 105, modulator 106, RF module 107, and antenna 108 discussed with reference to transmit path 100 of FIG. 1A and thus their operation will not be discussed in detail below.

Figure 5:
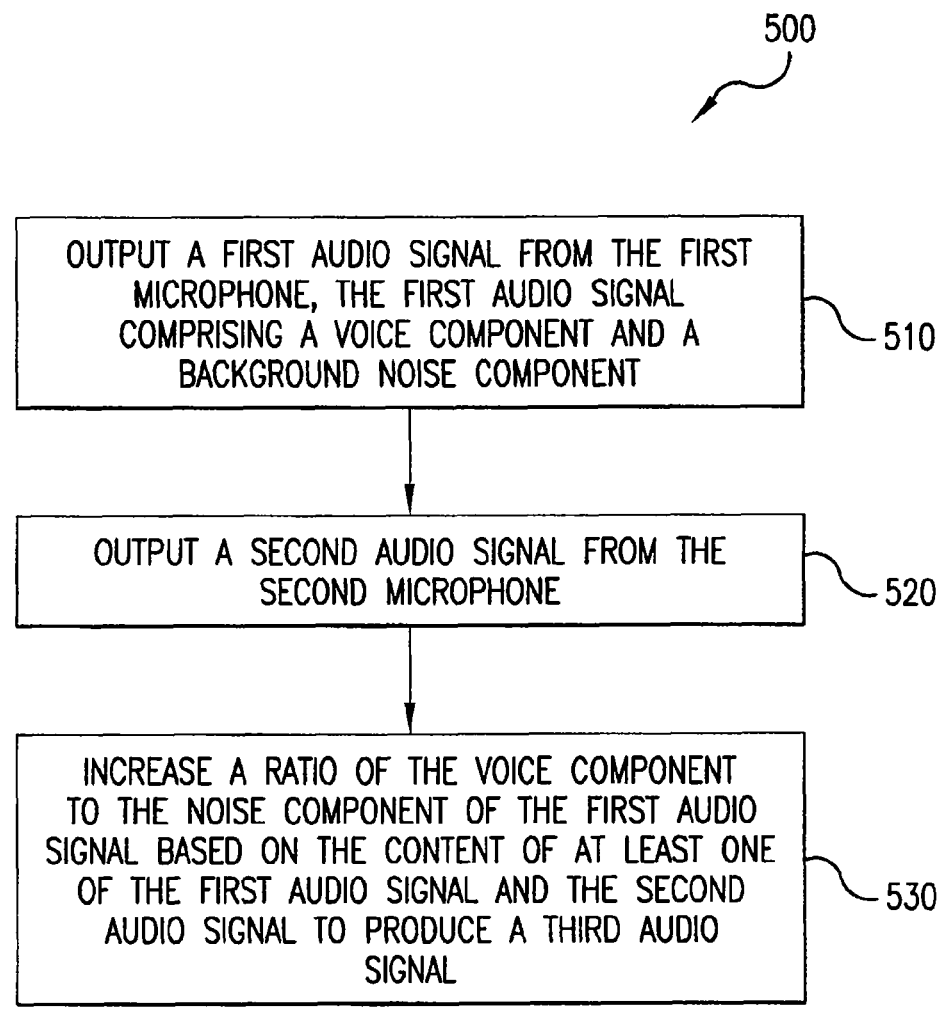
FIG. 5 illustrates a flowchart of a method for processing audio signals in a wireless telephone having a first microphone and a second microphone in accordance with an embodiment of the present invention.

The method by which audio signals are processed along transmit path 400 of the wireless telephone depicted in FIG. 4 will now be described with reference to the flowchart 500 of FIG. 5. The present invention, however, is not limited to the description provided by the flowchart 500. Rather, it will be apparent to persons skilled in the relevant art(s) from the teachings provided herein that other functional flows are within the scope and spirit of the present invention.

The method of flowchart 500 begins at step 510, in which first microphone 201 outputs a first audio signal, which includes a voice component and a background noise component. A/D converter 410 receives the first audio signal and converts it from an analog to digital format before providing it to signal processor 420.

At step 520, second microphone 202 outputs a second audio signal, which also includes a voice component and a background noise component. A/D converter 412 receives the second audio signal and converts it from an analog to digital format before providing it to signal processor 420.

At step 530, signal processor 420 receives and processes the first and second audio signals, thereby generating a third audio signal. In particular, signal processor 420 increases a ratio of the voice component to the noise component of the first audio signal based on the content of the second audio signal to produce a third audio signal.

The third audio signal is then provided directly to speech encoder 404. Speech encoder 404 and channel encoder 405 operate to encode the third audio signal using any of a variety of well known speech and channel encoding techniques. Modulator 406, RF module and antenna 408 then operate in a well-known manner to transmit the encoded audio signal to another telephone.

As will be discussed in more detail herein, signal processor 420 may comprise a background noise cancellation module and/or a noise suppressor. The manner in which the background noise cancellation module and the noise suppressor operate are described in more detail in subsections III and IV, respectively.

Figure 6:
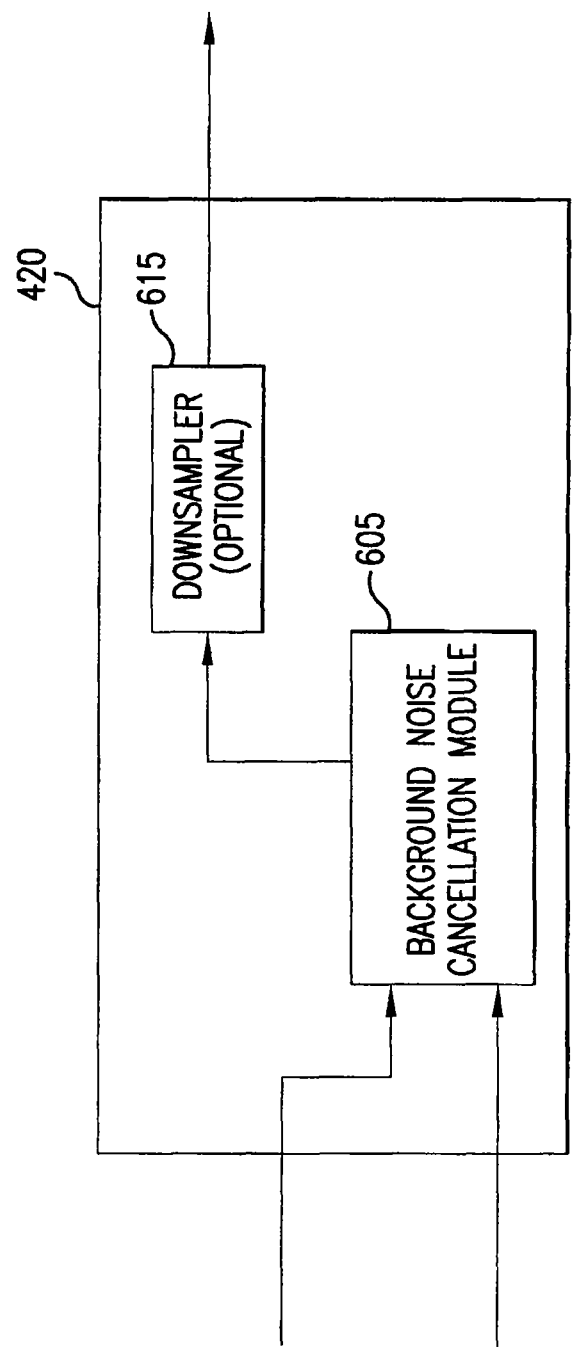
FIG. 6 is a functional block diagram of a signal processor in accordance with an embodiment of the present invention.

III. Use of two Microphones to Perform Background Noise Cancellation in Accordance with an Embodiment of the Present Invention FIG. 6 depicts an embodiment in which signal processor 420 includes a background noise cancellation module 605 and a downsampler 615 (optional). Background noise cancellation module 605 receives the first and second audio signals output by the first and second microphones 201 and 202, respectively. Background noise cancellation module 605 uses the content of the second audio signal to cancel a background noise component present in the first audio signal to produce a third audio signal. The details of the cancellation are described below with reference to FIGS. 7 and 8. The third audio signal is sent to the rest of transmit path 400 before being transmitted to the telephone of a far-end user.

Figure 7:
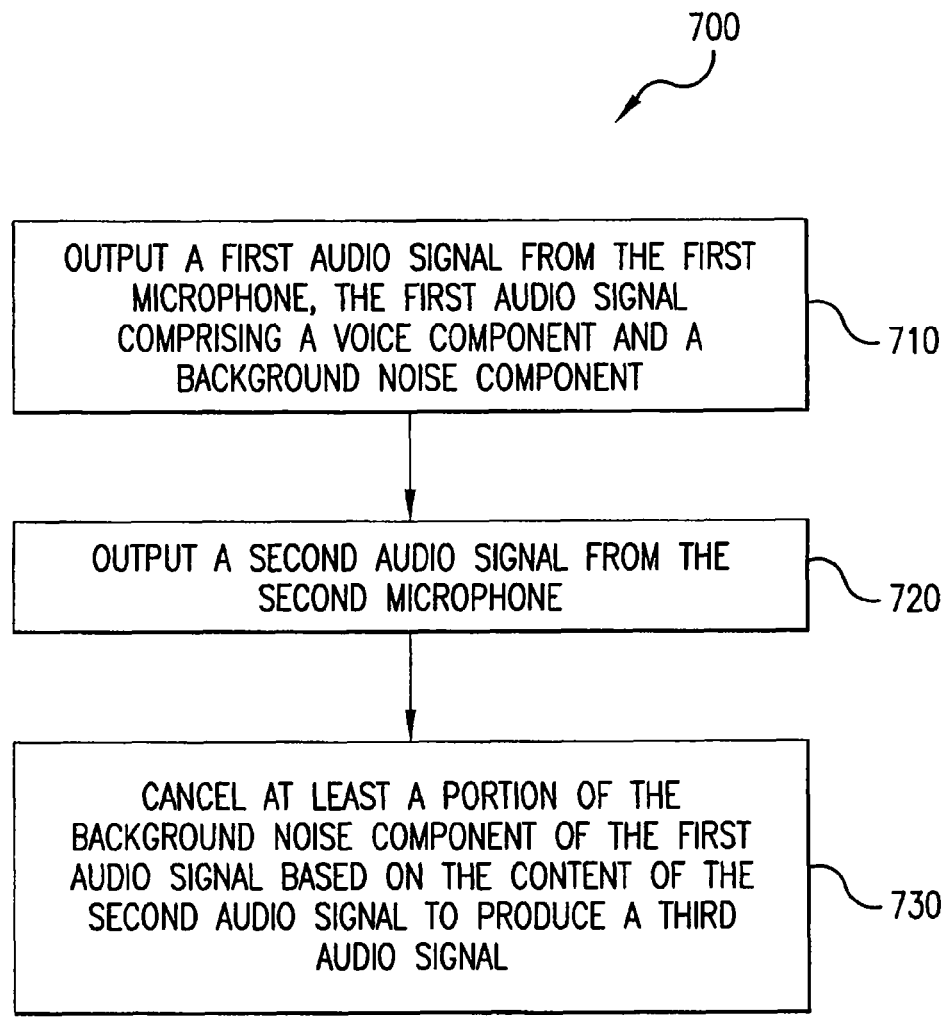
FIG. 7 illustrates a flowchart of a method for processing audio signals in a wireless telephone having a first microphone and a second microphone in accordance with an embodiment of the present invention.

FIG. 7 illustrates a flowchart 700 of a method for processing audio signals using a wireless telephone having two microphones in accordance with an embodiment of the present invention. Flowchart 700 is used to facilitate the description of how background noise cancellation module 605 cancels at least a portion of a background noise component included in the first audio signal output by first microphone 201.

The method of flowchart 700 starts at step 710, in which first microphone 201 outputs a first audio signal. The first audio signal includes a voice component and a background noise component. In step 720, second microphone 202 outputs a second audio signal. Similar to the first audio signal, the second audio signal includes a voice component and a background noise component.

Figure 8:
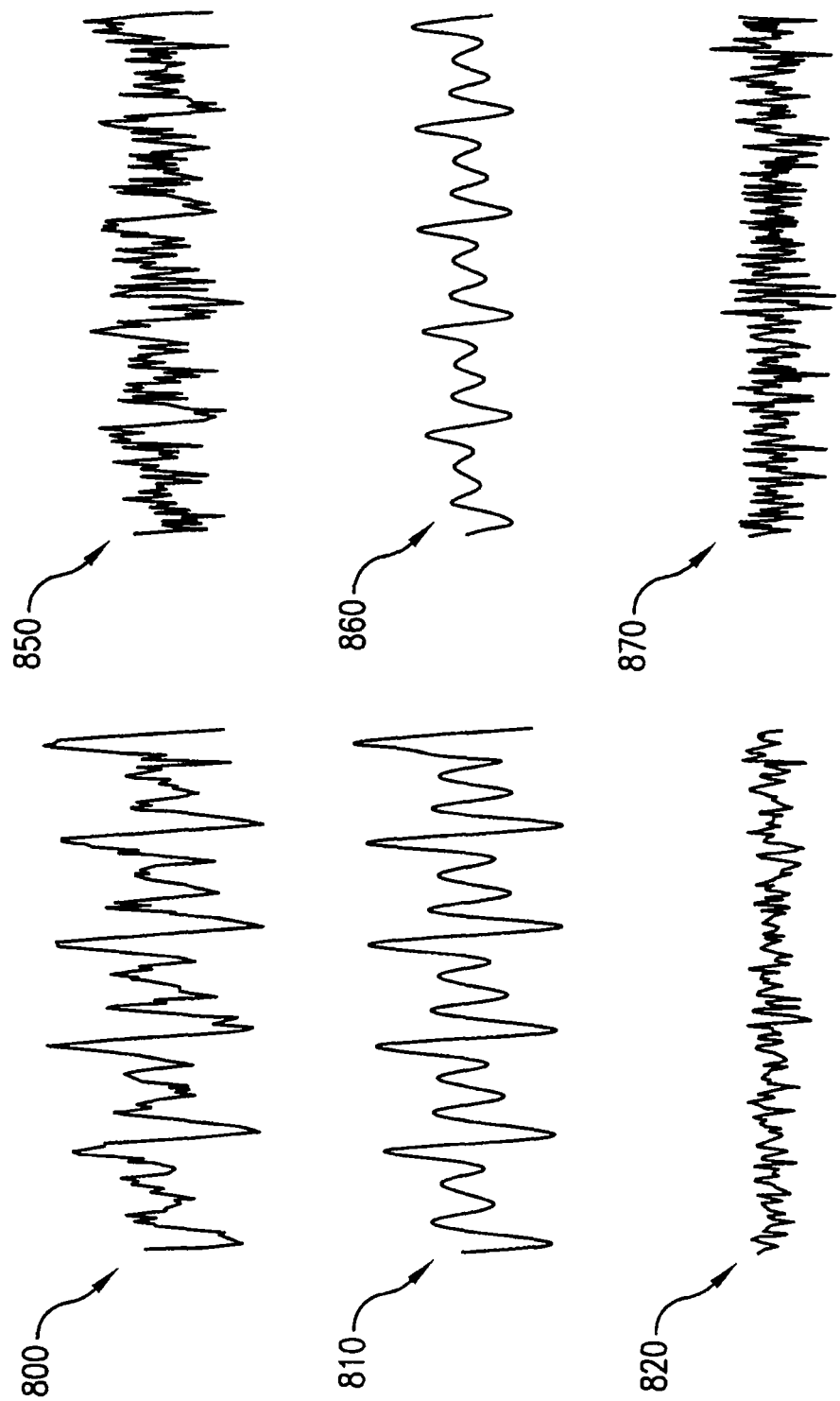
FIG. 8 illustrates voice and noise components output from first and second microphones, in an embodiment of the present invention.

FIG. 8 shows exemplary outputs from first and second microphones 201 and 202, respectively, upon which background noise cancellation module 605 may operate. FIG. 8 shows an exemplary first audio signal 800 output by first microphone 201. First audio signal 800 consists of a voice component 810 and a background noise component 820, which are also separately depicted in FIG. 8 for illustrative purposes. FIG. 8 further shows an exemplary second audio signal 850 output by second microphone 202. Second audio signal 850 consists of a voice component 860 and a background noise component 870, which are also separately depicted in FIG. 8. As can be seen from FIG. 8, the amplitude of the voice component picked up by first microphone 201 (i.e., voice component 810) is advantageously greater than the amplitude of the voice component picked up by second microphone 202 (i.e., voice component 860), and vice versa for the background noise components. As was discussed earlier, the relative amplitude of the voice component (background noise component) picked up by first microphone 201 and second microphone 202 is a function of their respective locations on wireless telephone 200.

At step 730 (FIG. 7), background noise cancellation module 605 uses the second audio signal to cancel at least a portion of the background noise component included in the first audio signal output by first microphone 201. Finally, the third audio signal produced by background noise cancellation module 605 is transmitted to another telephone. That is, after background noise cancellation module 605 cancels out at least a portion of the background noise component of the first audio signal output by first microphone 201 to produce a third audio signal, the third audio signal is then processed through the standard components or processing steps used in conventional encoder/decoder technology, which were described above with reference to FIG. 1A. The details of these additional signal processing steps are not described further for brevity.

Figure 9:
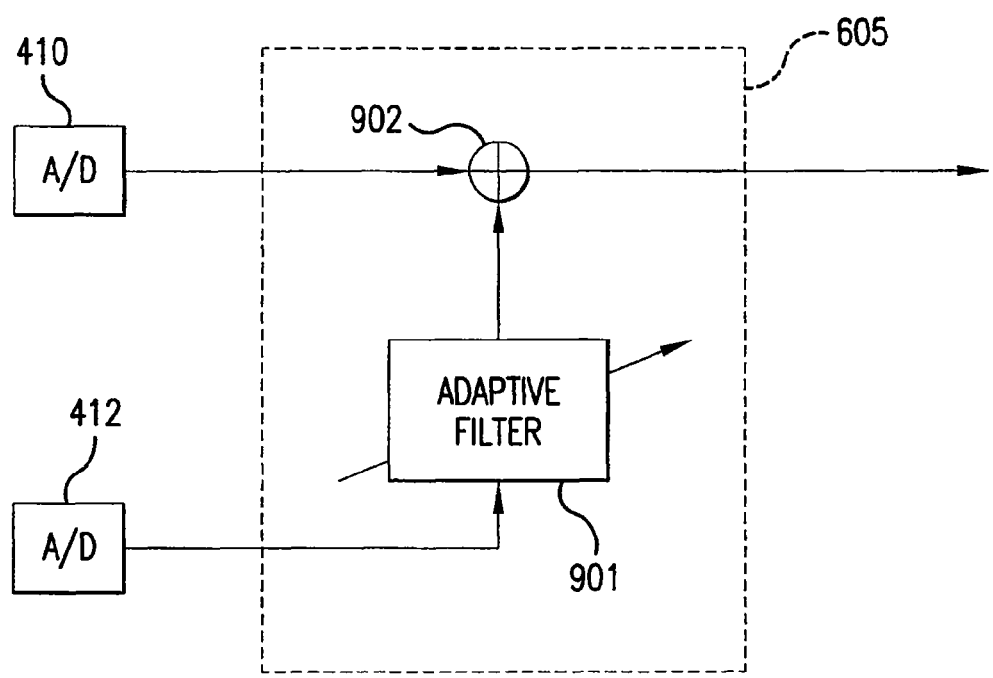
FIG. 9 is a functional block diagram of a background noise cancellation module in accordance with an embodiment of the present invention.

In one embodiment, background noise cancellation module 605 includes an adaptive filter and an adder. FIG. 9 depicts a background noise cancellation module 605 including an adaptive filter 901 and an adder 902. Adaptive filter 901 receives the second audio signal from second microphone 202 and outputs an audio signal. Adder 902 adds the first audio signal, received from first microphone 201, to the audio signal output by adaptive filter 901 to produce a third audio signal. By adding the first audio signal to the audio signal output by adaptive filter 901, the third audio signal produced by adder 902 has at least a portion of the background noise component that was present in the first audio signal cancelled out.

In another embodiment of the present invention, signal processor 420 includes a background noise cancellation module 605 and a downsampler 615. In accordance with this embodiment, A/D converter 410 and A/D converter 412 sample the first and second audio signals output by first and second microphones 201 and 202, respectively, at a higher sampling rate than is typically used within wireless telephones. For example, the first audio signal output by first microphone 201 and the second audio signal output by second microphones 202 can be sampled at 16 kHz by A/D converters 410 and 412, respectively; in comparison, the typical signal sampling rate used in a transmit path of most conventional wireless telephones is 8 kHz. After the first and second audio signals are processed through background noise cancellation module 605 to cancel out the background noise component from the first audio signal, downsampler 615 downsamples the third audio signal produced by background cancellation module 605 back to the proper sampling rate (e.g. 8 kHz). The higher sampling rate of this embodiment offers more precise time slicing and more accurate time matching, if added precision and accuracy are required in the background noise cancellation module 605.

As mentioned above and as is described in more detail in the next subsection, additionally or alternatively, the audio signal output by the second microphone is used to improve noise suppression of the audio signal output by the first microphone.

Figure 10:
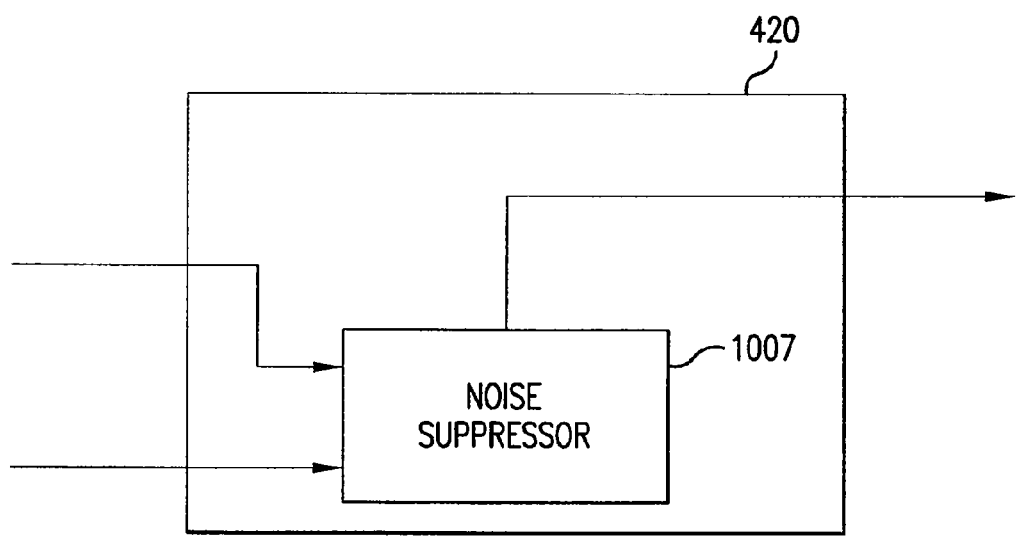
FIG. 10 is a functional block diagram of a signal processor in accordance with an embodiment of the present invention.

IV. Use of Two Microphones to Perform Improved Noise Suppression in Accordance with an Embodiment of the Present Invention As noted above, signal processor 420 may include a noise suppressor. FIG. 10 shows an embodiment in which signal processor 420 includes a noise suppressor 1007. In accordance with this embodiment, noise suppressor 1007 receives the first audio signal and the second audio signal output by first and second microphones 201 and 202, respectively. Noise suppressor 1007 suppresses at least a portion of the background noise component included in the first audio signal based on the content of the first audio signal and the second audio signal. The details of this background noise suppression are described in more detail with reference to FIG. 11.

Figure 11:
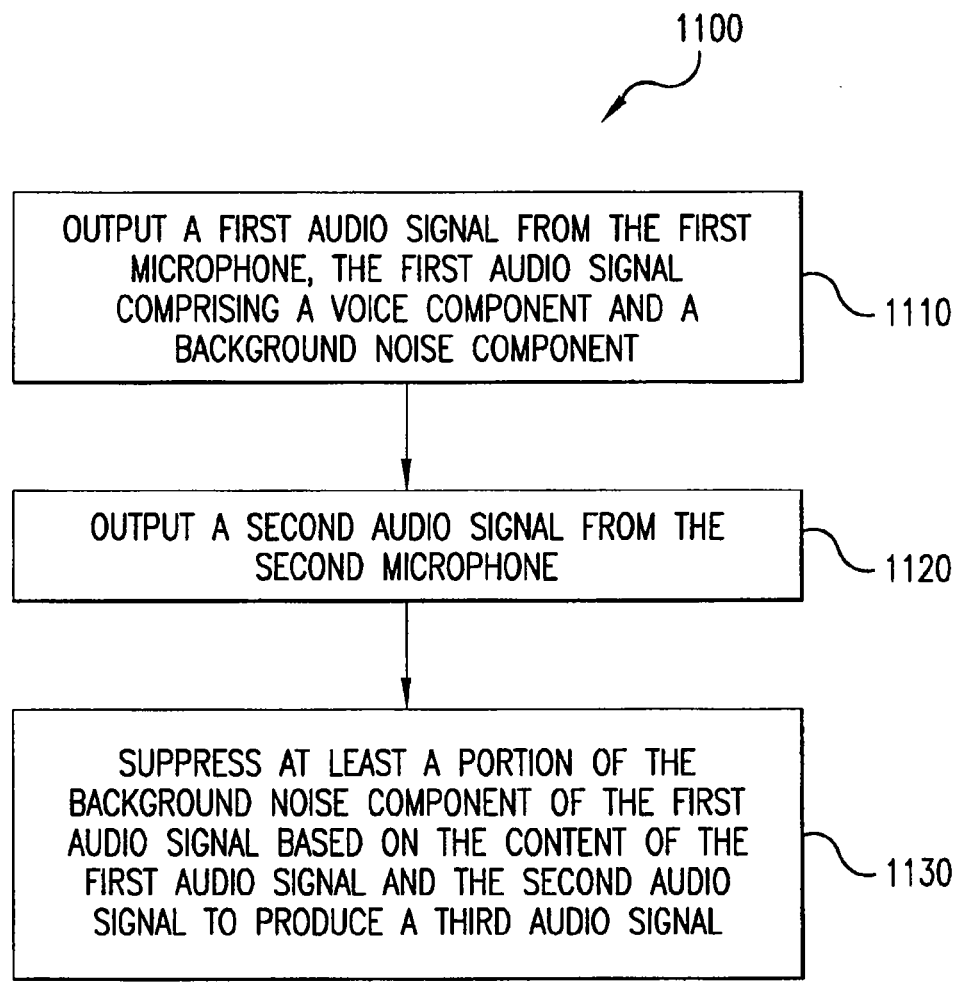
FIG. 11 illustrates a flowchart of a method for processing audio signals in a wireless telephone having a first microphone and a second microphone in accordance with an embodiment of the present invention.

FIG. 11 illustrates a flowchart 1100 of a method for processing audio signals using a wireless telephone having a first and a second microphone in accordance with an embodiment of the present invention. This method is used to suppress at least a portion of the background noise component included in the output of the first microphone.

The method of flowchart 1100 begins at step 1110, in which first microphone 201 outputs a first audio signal that includes a voice component and a background noise component. In step 1120, second microphone 202 outputs a second audio signal that includes a voice component and a background noise component.

At step 1130, noise suppressor 1007 receives the first and second audio signals and suppresses at least a portion of the background noise component of the first audio signal based on the content of the first and second audio signals to produce a third audio signal. The details of this step will now be described in more detail.

Figure 12A:
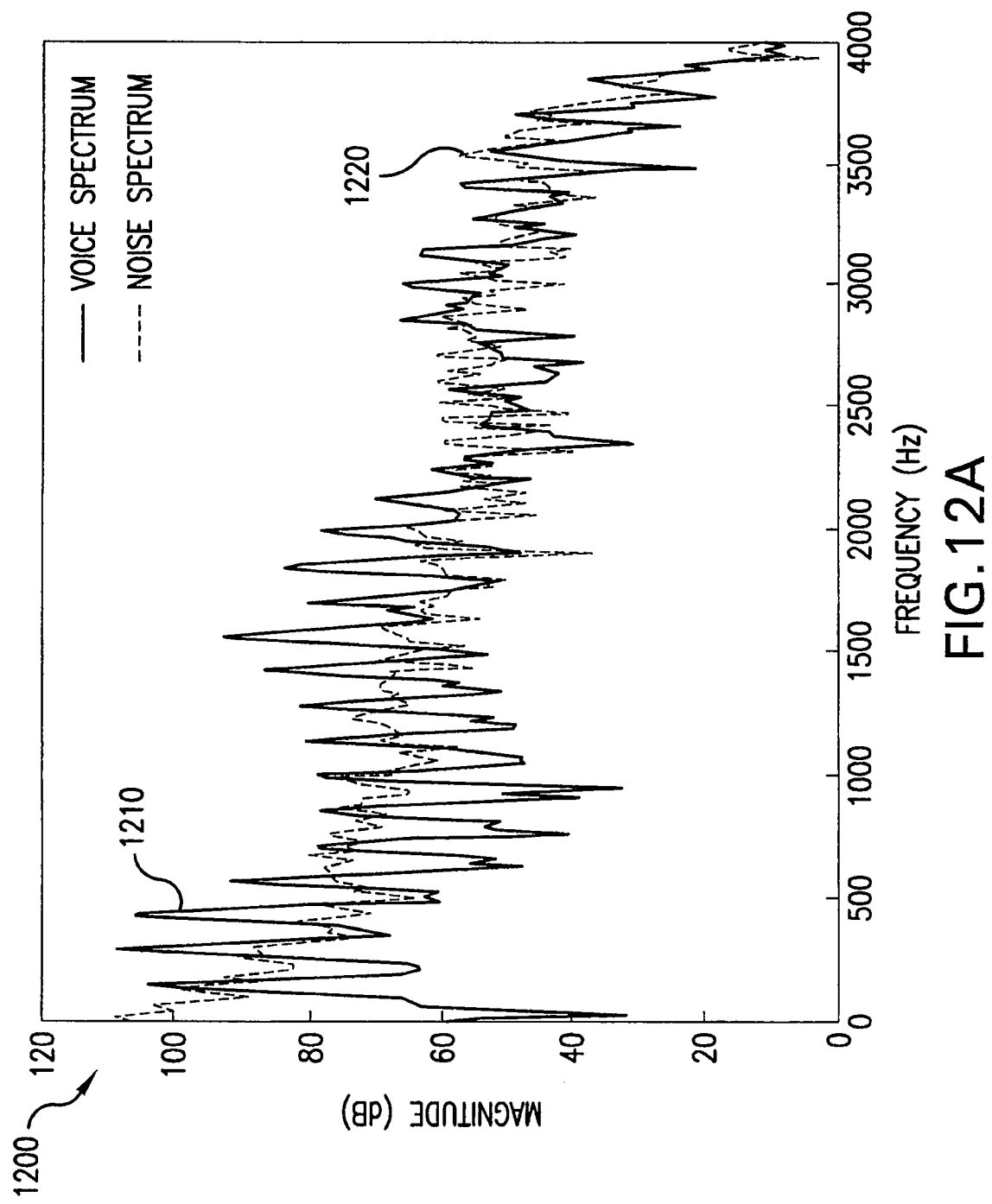
FIG. 12A illustrates an exemplary frequency spectrum of a voice component and a background noise component of a first audio signal output by a first microphone, in an embodiment of the present invention.
Figure 12B:
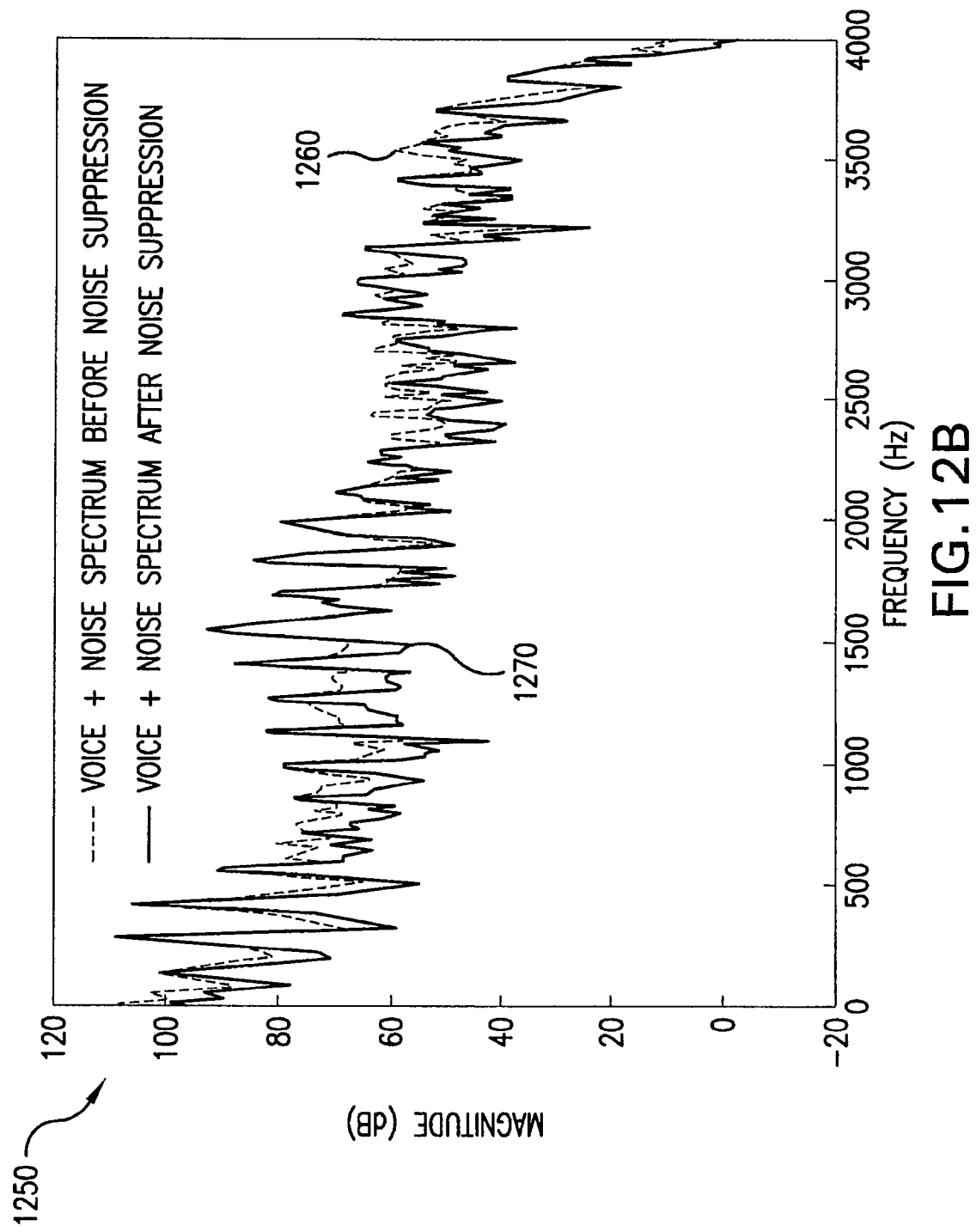
FIG. 12B illustrates an exemplary frequency spectrum of an audio signal upon which noise suppression has been performed, in accordance with an embodiment of the present invention.

In one embodiment, noise suppressor 1007 converts the first and second audio signals into the frequency domain before suppressing the background noise component in the first audio signal. FIGS. 12A and 12B show exemplary frequency spectra that are used to illustrate the function of noise suppressor 1007.

FIG. 12A shows two components: a voice spectrum component 1210 and a noise spectrum component 1220. Voice spectrum 1210 includes pitch harmonic peaks (the equally spaced peaks) and the three formats in the spectral envelope.

FIG. 12A is an exemplary plot used for conceptual illustration purposes only. It is to be appreciated that voice component 1210 and noise component 1220 are mixed and inseparable in audio signals picked up by actual microphones. In reality, a microphone picks up a single mixed voice and noise signal and its spectrum.

FIG. 12B shows an exemplary single mixed voice and noise spectrum before noise suppression (i.e., spectrum 1260) and after noise suppression (i.e., spectrum 1270). For example, spectrum 1260 is the magnitude of a Fast Fourier Transform (FFT) of the first audio signal output by first microphone 201.

A typical noise suppressor keeps an estimate of the background noise spectrum (e.g., spectrum 1220 in FIG. 12A), and then compares the observed single voice and noise spectrum (e.g., spectrum 1260 in FIG. 12B) with this estimated background noise spectrum to determine whether each frequency component is predominately voice or predominantly noise. If it is considered predominantly noise, the magnitude of the FFT coefficient at that frequency is attenuated. If it is considered predominantly voice, then the FFT coefficient is kept as is. This can be seen in FIG. 12B.

There are many frequency regions where spectrum 1270 is on top of spectrum 1260. These frequency regions are considered to contain predominantly voice. On the other hand, regions where spectrum 1260 and spectrum 1270 are at different places are the frequency regions that are considered predominantly noise. By attenuating the frequency regions that are predominantly noise, noise suppressor 1007 produces a third audio signal (e.g., an audio signal corresponding to frequency spectrum 1270) with an increased ratio of the voice component to background noise component compared to the first audio signal.

The operations described in the last two paragraphs above correspond to a conventional single-microphone noise suppression scheme. According to an embodiment of the present invention, noise suppressor 1007 additionally uses the spectrum of the second audio signal picked up by the second microphone to estimate the background noise spectrum 1220 more accurately than in a single-microphone noise suppression scheme.

In a conventional single-microphone noise suppressor, background noise spectrum 1220 is estimated between "talk spurts", i.e., during the gaps between active speech segments corresponding to uttered syllables. Such a scheme works well only if the background noise is relatively stationary, i.e., when the general shape of noise spectrum 1220 does not change much during each talk spurt. If noise spectrum 1220 changes significantly through the duration of the talk spurt, then the single-microphone noise suppressor will not work well because the noise spectrum estimated during the last "gap" is not reliable. Therefore, in general, and especially for non-stationary background noise, the availability of the spectrum of the second audio signal picked up by the second microphone allows noise suppressor 1007 to get a more accurate, up-to-date estimate of noise spectrum 1220, and thus achieve better noise suppression performance.

Note that the spectrum of the second audio signal should not be used directly as the estimate of the noise spectrum 1220. There are at least two problems with using the spectrum of the second audio signal directly: first, the second audio signal may still have some voice component in it; and second, the noise component in the second audio signal is generally different from the noise component in the first audio signal.

To circumvent the first problem, the voice component can be cancelled out of the second audio signal. For example, in conjunction with a noise cancellation scheme, the noise-cancelled version of the first audio signal, which is a cleaner version of the main voice signal, can pass through an adaptive filter. The signal resulting from the adaptive filter can be added to the second audio signal to cancel out a large portion of the voice component in the second audio signal.

To circumvent the second problem, an approximation of the noise component in the first audio signal can be determined, for example, by filtering the voice-cancelled version of the second audio signal with adaptive filter 901.

The example method outlined above, which includes the use of a first and second audio signal, allows noise suppressor 1007 to obtain a more accurate and up-to-date estimate of noise spectrum 1220 during a talk spurt than a conventional noise suppression scheme that only uses one audio signal. An alternative embodiment of the present invention can use the second audio signal picked up by the second microphone to help obtain a more accurate determination of talk spurts versus inter-syllable gaps; and this will, in turn, produce a more reliable estimate of noise spectrum 1220, and thus improve the noise suppression performance.

For the particular example of FIG. 12B, spectrum 1260 in the noise regions is attenuated by 10 dB resulting in spectrum 1270. It should be appreciated that an attenuation of 10 dB is shown for illustrative purposes, and not limitation. It will be apparent to persons having ordinary skill in the art that spectrum 1260 could be attenuated by more or less than 10 dB.

Lastly, the third audio signal is transmitted to another telephone. The processing and transmission of the third audio signal is achieved in like manner to that which was described above in reference to conventional transmit path 100 (FIG. 1A).

As mentioned above and as is described in more detail in the next subsection, additionally or alternatively, the audio signal output by the second microphone is used to improve VAD technology incorporated within the wireless telephone.

Figure 13:
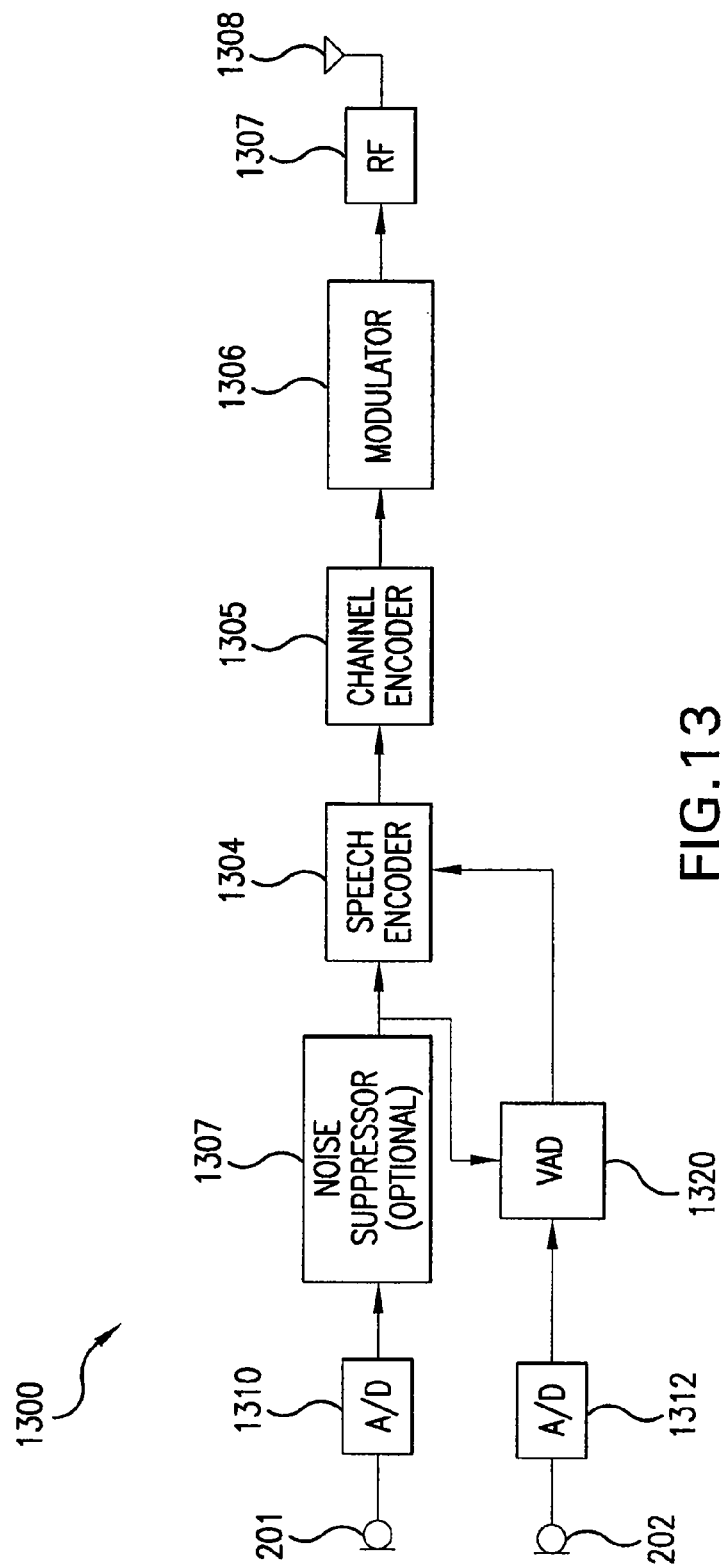
FIG. 13 is a functional block diagram of a transmit path of a wireless telephone in accordance with an embodiment of the present invention.

V. Use of Two Microphones to Perform Improved VAD in Accordance with an Embodiment of the Present Invention FIG. 13 is a functional block diagram of a transmit path 1300 of a wireless telephone that is implemented with a first microphone and a second microphone in accordance with an embodiment of the present invention. Transmit path 1300 includes a first microphone 201 and a second microphone 202. In addition, transmit path 1300 includes an A/D converter 1310, an A/D converter 1312, a noise suppressor 1307 (optional), a VAD 1320, a speech encoder 1304, a channel encoder 1305, a modulator 1306, an RF module 1307, and an antenna 1308. Speech encoder 1304, channel encoder 1305, modulator 1306, RF module 1307, and antenna 1308 are respectively analogous to speech encoder 104, channel encoder 105, modulator 106, RF module 107, and antenna 108 discussed with reference to transmit path 100 of FIG. 1A and thus their operation will not be discussed in detail below.

For illustrative purposes and not limitation, transmit path 1300 is described in an embodiment in which noise suppressor 1307 is not present. In this example embodiment, VAD 1320 receives the first audio signal and second audio signal output by first microphone 201 and the second microphone 202, respectively. VAD 1320 uses both the first audio signal output by the first microphone 201 and the second audio signal output by second microphone 202 to provide detection of voice activity in the first audio signal. VAD 1320 sends an indication signal to speech encoder 1304 indicating which time intervals of the first audio signal include a voice component. The details of the function of VAD 1320 are described with reference to FIG. 14.

Figure 14:
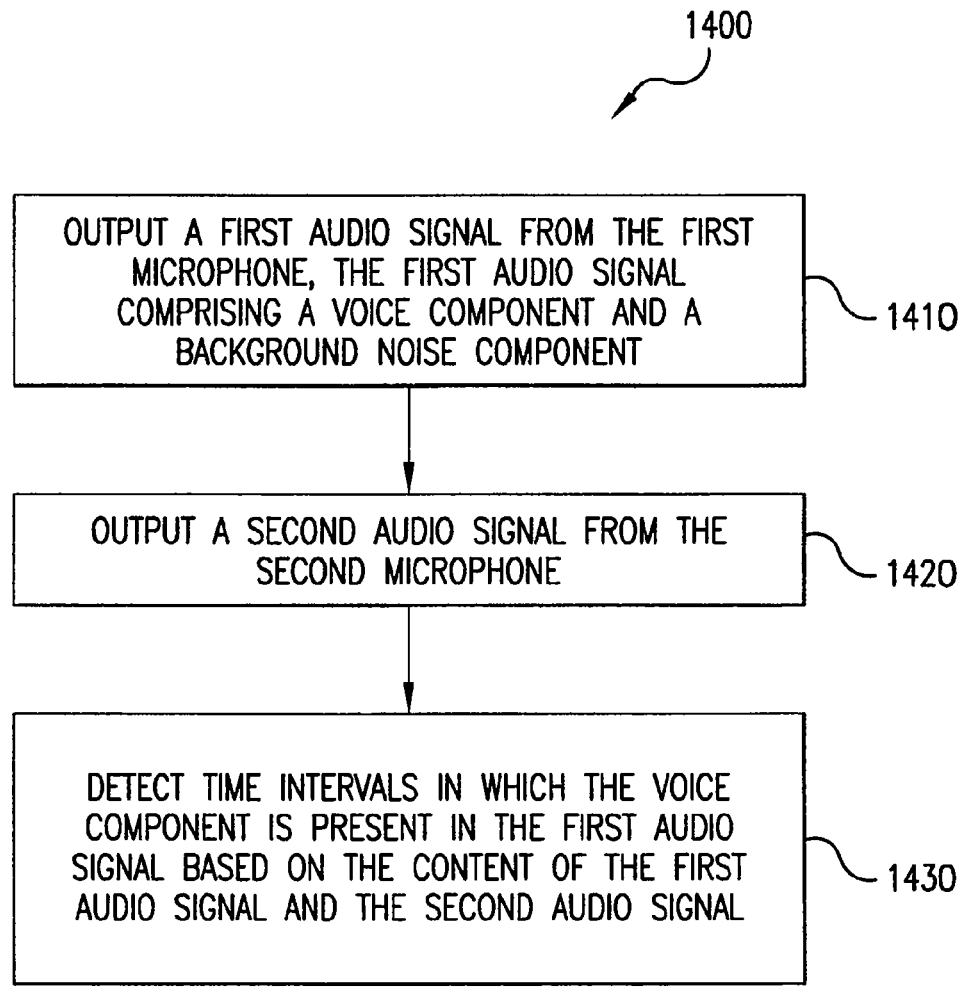
FIG. 14 is a flowchart depicting a method for processing audio signals in a wireless telephone having a first microphone and a second microphone in accordance with an embodiment of the present invention.

FIG. 14 illustrates a flowchart 1400 of a method for processing audio signals in a wireless telephone having a first and a second microphone, in accordance with an embodiment of the present invention. This method is used to detect time intervals in which an audio signal output by the first microphone includes a voice component.

The method of flowchart 1400 begins at step 1410, in which first microphone 201 outputs a first audio signal the includes a voice component and a background noise component. In step 1420, second microphone 202 outputs a second audio signal that includes a voice component and a background noise component.

FIG. 15 shows exemplary plots of the first and second audio signals output by first and second microphones 201 and 202, respectively. Plot 1500 is a representation of the first audio signal output by first microphone 201. The audio signal shown in plot 1500 includes a voice component 1510 and a background noise component 1520. The audio signal shown in plot 1550 is a representation of the second audio signal output by second microphone 202. Plot 1550 also includes a voice component 1560 and a background noise component 1570. As discussed above, since first microphone 201 is preferably closer to a user's mouth during regular use than second microphone 202, the amplitude of voice component 1510 is greater than the amplitude of voice component 1560. Conversely, the amplitude of background noise component 1570 is greater than the amplitude of background noise component 1520.

As shown in step 1430 of flowchart. 1400, VAD 1320, based on the content of the first audio signal (plot 1500) and the second audio signal (plot 1550), detects time intervals in which voice component 1510 is present in the first audio signal. By using the second audio signal in addition to the first audio signal to detect voice activity in the first audio signal, VAD 1320 achieves improved voice activity detection as compared to VAD technology that only monitors one audio signal. That is, the additional information coming from the second audio signal, which includes mostly background noise component 1570, helps VAD 1320 better differentiate what in the first audio signal constitutes the voice component, thereby helping VAD 1320 achieve improved performance.

As an example, according to an embodiment of the present invention, in addition to all the other signal features that a conventional single-microphone VAD normally monitors, VAD 1320 can also monitor the energy ratio or average magnitude ratio between the first audio signal and the second audio signal to help it better detect voice activity in the first audio signal. This possibility is readily evident by comparing first audio signal 1500 and second audio signal 1550 in FIG. 15. For audio signals 1500 and 1550 shown in FIG. 15, the energy of first audio signal 1500 is greater than the energy of second audio signal 1550 during talk spurt (active speech).

On the other hand, during the gaps between talk spurts (i.e. background noise only regions), the opposite is true. Thus, the energy ratio of the first audio signal over the second audio signal goes from a high value during talk spurts to a low value during the gaps between talk spurts. This change of energy ratio provides a valuable clue about voice activity in the first audio signal. This valuable clue is not available if only a single microphone is used to obtain the first audio signal. It is only available through the use of two microphones, and VAD 1320 can use this energy ratio to improve its accuracy of voice activity detection.

VI. Alternative Embodiments of the Present Invention

In an example alternative embodiment (not shown), signal processor 420 includes both a background noise cancellation module and a noise suppressor. In this embodiment, the background noise cancellation module cancels at least a portion of a background noise component included in the first audio signal based on the content of the second audio signal to produce a third audio signal. Then the noise suppressor receives the second and third audio signals and suppresses at least a portion of a residual background noise component present in the third audio signal based on the content of the second audio signal and the third audio signal, in like manner to that described above. The noise suppressor then provides a fourth audio signal to the remaining components and/or processing steps, as described above.

In another alternative example embodiment, a transmit path having a first and second microphone can include a signal processor (similar to signal processor 420) and a VAD (similar to VAD 1320). A person having ordinary skill in the art will appreciate that a signal processor can precede a VAD in a transmit path, or vice versa. In addition, a signal processor and a VAD can process the outputs of the two microphones contemporaneously. For illustrative purposes, and not limitation, an embodiment in which a signal processor precedes a VAD in a transmit path having two microphones is described in more detail below.

In this illustrative embodiment, a signal processor increases a ratio of a voice component to a background noise component of a first audio signal based on the content of at least one of the first audio signal and a second audio signal to produce a third audio signal (similar to the function of signal processor 420 described in detail above). The third audio signal is then received by a VAD. The VAD also receives a second audio signal output by a second microphone (e.g., second microphone 202). In a similar manner to that described in detail above, the VAD detects time intervals in which a voice component is present in the third signal based on the content of the second audio signal and the third audio signal.

In a still further embodiment, a VAD can precede a noise suppressor, in a transmit path having two microphones. In this embodiment, the VAD receives a first audio signal and a second audio signal output by a first microphone and a second microphone, respectively, to detect time intervals in which a voice component is present in the first audio signal based on the content of the first and second audio signals, in like manner to that described above. The noise suppressor receives the first and second audio signals and suppresses a background noise component in the first audio signal based on the content of the first audio signal and the second audio signal, in like manner to that described above.

VII. Conclusion

A wireless telephone implemented with at least two microphones has been disclosed. Specific reference to a wireless telephone having two microphones was presented for illustrative purposes only, and not limitation. It will be apparent to a person having ordinary skill in the art that other types of telephones (e.g., corded telephones, corded telephone headsets, and/or BLUETOOTH™ telephone headsets, developed by Bluetooth SIG, Inc. of Overland Park, Kans., U.S.A.) could be implemented with a first and second microphone. In the example of the corded telephone headset, the first microphone could be mounted on the headset and the second microphone could be mounted on a handset of the telephone. For example, the second microphone could be mounted on the telephone in like manner to either microphone 201 or microphone 202 of wireless telephone 200. As another example, a BLUETOOTH™ wireless telephone headset can have a first microphone mounted at the tip of its microphone boom close to the mouth of a user and a second microphone mounted at its base, which is supported near one of the user's ears by a hook over the ear lobe. It is to be appreciated that these other types of telephones and/or headsets implemented with a first and second microphone are contemplated within the scope of the present invention.

The specifications and the drawings used in the foregoing description were meant for exemplary purposes only, and not limitation. It is intended that the full scope and spirit of the present invention be determined by the claims that follow.

What is claimed is:

1. An audio-processing engine for use in a telephone, comprising:
   a first input configured to receive a first audio signal from a first microphone, wherein the first audio signal includes a first voice signal and a first noise signal;
   a second input configured to receive a second audio signal from a second microphone, wherein the second audio signal includes a second voice signal and a second noise signal; and
   a signal-processing module coupled to the first and second inputs and configured to compare an energy of the first audio signal to an energy of the second audio signal in order to discriminate between voice activity and noise in the first audio signal, wherein an energy of the first voice signal exceeds an energy of the first noise signal, or an energy of the second voice signal exceeds an energy of the second noise signal, and
   wherein the signal-processing module is further configured to identify time intervals of the first audio signal during which voice activity is present based on the comparison between the energy of the first audio signal and the energy of the second audio signal.

2. The audio-processing engine of claim 1, wherein the signal-processing module is further configured to compare an energy ratio between the first audio signal and the second audio signal.

3. The audio-processing engine of claim 1, wherein the first audio signal and the second audio signal undergo a frequency analysis.

4. The audio-processing engine of claim 3, wherein the frequency analysis comprises a Fast Fourier Transform.

5. The audio-processing engine of claim 1, wherein:
   the first input comprises a first analog-to-digital (A/D) converter configured to convert the first audio signal from an analog form to a digital form; and
   the second input comprises a second A/D converter configured to convert the second audio signal from an analog form to a digital form.

6. The audio-processing engine of claim 1, wherein the first voice signal and the second voice signal have different energy levels.

7. The audio-processing engine of claim 1, wherein the signal-processing module is further configured to suppress at least a portion of the noise of the first audio signal.

8. A telephone, comprising:
- a first microphone configured to provide a first audio signal, wherein the first audio signal includes a first voice signal and a first noise signal;
- a second microphone configured to provide a second audio signal, wherein the second audio signal includes a second voice signal and a second noise signal; and
- a signal-processing module coupled to the first and second microphones and configured to compare an energy of the first audio signal to an energy of the second audio signal in order to discriminate between voice activity and noise in the first audio signal, wherein an energy of the first voice signal exceeds an energy of the first noise signal, or an energy of the second voice signal exceeds an energy of the second noise signal, and
- wherein the signal-processing module is further configured to identify time intervals of the first audio signal during which voice activity is present based on the comparison between the energy of the first audio signal and the energy of the second audio signal.

9. The telephone of claim 8, wherein the signal-processing module is further configured to compare an energy ratio between the first audio signal and the second audio signal.

10. The telephone of claim 8, wherein the first audio signal and the second audio signal undergo a frequency analysis.

11. The telephone of claim 8, wherein the frequency analysis comprises a Fast Fourier Transform.

12. The telephone of claim 8, further comprising:
- a first analog-to-digital (A/D) converter configured to convert the first audio signal from an analog form to a digital form; and
- a second A/D converter configured to convert the second audio signal from an analog form to a digital form.

13. The telephone of claim 8, wherein the signal-processing module is further configured to suppress at least a portion of the noise of the first audio signal.

14. A method for processing audio signals in a telephone, comprising:
- receiving a first audio signal from a first microphone, wherein the first audio signal includes a first voice signal and a first noise signal;
- receiving a second audio signal from a second microphone, wherein the second audio signal includes a second voice signal and a second noise signal;
- comparing an energy of the first audio signal to an energy of the second audio signal in order to discriminate between voice activity and noise in the first audio signal, wherein an energy of the first voice signal exceeds an energy of the first noise signal, or an energy of the second voice signal exceeds an energy of the second noise signal, and
- identifying time intervals of the first audio signal during which voice activity is present based on the comparison between the energy of the first audio signal and the energy of the second audio signal.

15. The method of claim 14, wherein the comparing an energy of the first audio signal to an energy of the second audio signal in order to discriminate between voice activity and noise in the first audio signal comprises:
- comparing an energy ratio between the first audio signal and the second audio signal.

16. The method of claim 13, further comprising:
- frequency analyzing the first audio signal and the second audio signal.

17. The method of claim 16, wherein the frequency analysis comprises a Fast Fourier Transform.

18. The method of claim 14, further comprising:
- converting the first audio signal from an analog form to a digital form; and converting the second audio signal from an analog form to a digital form.

19. The method of claim 14, wherein the first voice signal and the second voice signal have different energy levels.

20. The method of claim 14, further comprising:
- suppressing at least a portion of the noise of the first audio signal.

* * * * *